US011101412B2

(12) United States Patent
Dirscherl (10) Patent No.: US 11,101,412 B2
(45) Date of Patent: Aug. 24, 2021

(54) METHOD FOR PRODUCING AN OUTPUT COUPLING ELEMENT FOR AN OPTOELECTRONIC COMPONENT AND OUTPUT COUPLING ELEMENT

(71) Applicant: OSRAM Opto Semiconductors GmbH, Regensburg (DE)

(72) Inventor: Georg Dirscherl, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 54 days.

(21) Appl. No.: 16/484,541

(22) PCT Filed: Jan. 30, 2018

(86) PCT No.: PCT/EP2018/052280
§ 371 (c)(1),
(2) Date: Aug. 8, 2019

(87) PCT Pub. No.: WO2018/145952
PCT Pub. Date: Aug. 16, 2018

(65) Prior Publication Data
US 2020/0058831 A1 Feb. 20, 2020

(30) Foreign Application Priority Data
Feb. 8, 2017 (DE) .......................... 102017102477.8

(51) Int. Cl.
*H01L 33/50* (2010.01)
*H01L 33/58* (2010.01)
(Continued)

(52) U.S. Cl.
CPC ........ *H01L 33/502* (2013.01); *C09K 11/0883* (2013.01); *C09K 11/70* (2013.01);
(Continued)

(58) Field of Classification Search
CPC combination set(s) only.
See application file for complete search history.

(56) References Cited

U.S. PATENT DOCUMENTS 8,174,034 B2 5/2012 Bogner et al.
2013/0143339 A1* 6/2013 Tischler ................ H01L 33/507
438/27
(Continued)

FOREIGN PATENT DOCUMENTS

DE 19755051 C1 5/1999
DE 102005032038 A1 1/2007
(Continued)

OTHER PUBLICATIONS

Bertolotti, J. et al., "Scattering Optics Resolve Nanostructure," Nanoengineering: Fabrication, Properties, Optics, and Devices VIII, Proc. of SPIE vol. 8102, 810206-1-810206-11, 2011, 11 pages.
(Continued)

*Primary Examiner* — Nduka E Ojeh
(74) *Attorney, Agent, or Firm* — Slater Matsil, LLP (57) ABSTRACT

A method for producing an output coupling element and an output coupling element are disclosed. In an embodiment a method includes producing a suspension having quantum dots in a suspension medium, wherein each quantum dot comprises a core having a semiconductor material, directly applying the suspension onto a surface of an optoelectronic component and/or onto a surface of a carrier and removing the suspension medium for producing the output coupling element, wherein the output coupling element is matrix-free and transparent to radiation of a red range and/or a IR range.

20 Claims, 6 Drawing Sheets

(51) Int. Cl.
*C09K 11/08* (2006.01)
*C09K 11/70* (2006.01)

(52) U.S. Cl.
CPC ...... *H01L 33/58* (2013.01); *H01L 2933/0041* (2013.01); *H01L 2933/0058* (2013.01)

(56) References Cited

U.S. PATENT DOCUMENTS

| | | | |
|---|---|---|---|
| 2014/0191265 | A1 | 7/2014 | Camras et al. |
| 2017/0044327 | A1* | 2/2017 | Li ............................ C08K 3/22 |
| 2018/0029072 | A1* | 2/2018 | Li ............................ G02B 5/201 |
| 2018/0190625 | A1* | 7/2018 | Steckel ............. G02F 1/133603 |
| 2018/0371312 | A1 | 12/2018 | Dirscherl |
| 2019/0221722 | A1 | 7/2019 | Dirscherl et al. |

FOREIGN PATENT DOCUMENTS

| | | |
|---|---|---|
| DE | 102007009530 A1 | 8/2008 |
| DE | 102015121720 A1 | 6/2017 |
| WO | 2013109908 A1 | 7/2013 |
| WO | 2017007770 A2 | 1/2017 |
| WO | 2018054992 A1 | 3/2018 |

OTHER PUBLICATIONS

Cui, D.L. et al., "The Stability and Surface Reactivity of Gallium Phosphide Nanocrystals," Progress in Crystal Growth and Characterization of Materials, 2000, 7 pages.

Pan, J. et al., "Synthesis and Surface Reactivity of Phosphide Nanocrystals," Science in China (Series A), vol. 45, No. 5, May 2002, 6 pages.

Wang, B.P. et al. "Fabrication and Optical Properties of Gallium Phosphide Nanoparticulate Thin Film, " Solid State Sciences 12, 2010, 4 pages.

Zhang, Z.C. et al., "Diamond and Oxidized Disordered Graphite on the Surface of Gallium Phosphide Nanoparticles," Part. Part. Syst. Charact. 26, 2009, 5 pages.

Gindele, F. et al., "Optical gain and high quantum efficiency of matrix-free, closely packed CdSe quantum dots," Appl. Phys. Letter 71 (15), Oct. 13, 1997, 3 pages.

* cited by examiner

METHOD FOR PRODUCING AN OUTPUT COUPLING ELEMENT FOR AN OPTOELECTRONIC COMPONENT AND OUTPUT COUPLING ELEMENT

This patent application is a national phase filing under section 371 of PCT/EP2018/052280, filed Jan. 30, 2018, which claims the priority of German patent application 102017102477.8, filed Feb. 8, 2017, each of which is incorporated herein by reference in its entirety.

TECHNICAL FIELD

The invention relates to a method of producing an output coupling element for an optoelectronic component. Furthermore, the invention relates to an output coupling element, in particular for an optoelectronic component.

BACKGROUND

The output coupling elements described previously exhibit insufficient decoupling of light generated in a semiconductor chip of an optoelectronic component, since there are large refractive index differences at the interface between the semiconductor chip surface and its surroundings. This problem is particularly relevant for semiconductor chips that emit radiation of the red or IR wavelength range and have InGaAlP- and/or GaAs-based materials with a high refractive index of n>3.

Semiconductor chips are typically embedded in a matrix material, such as silicone or epoxy, with a refractive index of 1.4 to 1.55. This increases the decoupling of the light emitted by the semiconductor chip compared to a semiconductor chip surrounded by air with a refractive index n=1. Furthermore, the matrix material acts as a barrier against environmental influences and can be shaped as a lens to efficiently decouple the radiation emitted by the semiconductor chip from the component. So far, nanoparticles such as zirconium oxide or titanium dioxide have been known as highly refractive additives for decoupling materials. Such nanocomposites of zirconium oxide and/or titanium dioxide and polymer matrix material have the disadvantage that they can only be applied as thin film materials and therefore cannot be formed as lenses. Previously investigated organically loaded zirconium oxide nanoparticles also turn yellow under blue light and temperature tests on their own or in a matrix material, such as silicone. In the case of InGaAlP/GaAs, the photonic energy of the targeted wavelengths of >600 nm is not sufficient to cleave bonds of typical matrix materials, especially thermo-oxidized species.

SUMMARY OF THE INVENTION

Embodiments provide a method for producing an output coupling element for an optoelectronic component that efficiently and simply produces an efficient output coupling element. Further embodiments provide an output coupling element for an optoelectronic component.

In at least one embodiment, the method for producing an output coupling element for an optoelectronic component includes the steps: A) providing quantum dots each with a core having a semiconductor material, B) producing a suspension having quantum dots in a suspension medium, C) directly applying the suspension onto a surface of the optoelectronic component and/or to a surface of a carrier; and D) removing the suspension medium to produce the output coupling element, which is matrix-free and transparent to radiation of the red and/or IR range.

According to at least one embodiment, step D) is optional.

According to at least one embodiment, the method has a step A), providing quantum dots. The quantum dots each have a core made of a semiconductor material. The semiconductor material can be selected from a group comprising gallium phosphide (GaP), indium phosphide (InP), gallium arsenide (GaAs) and indium gallium aluminum phosphide (InGaAlP). Preferably, the semiconductor material is gallium phosphide or indium phosphide, particularly preferably gallium phosphide. The quantum dots are in particular transparent to radiation of the red and/or IR wavelength range. Gallium phosphide, for example, has a transparency with an absorption coefficient k=0 at wavelengths >500 nm. Indium phosphide has an absorption coefficient k=0.15 for a wavelength of 850 nm and an absorption coefficient k=0 for 953.7 nm. Indium phosphide nanoparticles are more easily accessible than gallium phosphide nanoparticles. Indium phosphide quantum dots would therefore be limited for the use of IR diodes with a wavelength of 950 nm.

Embodiments provide a significant increase in the refractive index by using, for example, gallium phosphide with a refractive index of 3.314 at 633 nm or indium phosphide with a refractive index of 3.536 at 633 nm in an output coupling element.

The quantum dots are preferably nanoparticles, i.e., particles with a size in the nanometer range with a particle diameter $d_{50}$, for example, between at least 1 nm and at most 1000 nm. Ideally, the particle diameter should not exceed approximately 1/10 of the wavelength, i.e., for example, a particle diameter of approximately 600 nm at 600 nm, so that the nanoparticles have as little negative influence as possible on the transparency of the overall nanocomposite system. The quantum dots comprise a core, i.e., a semiconductor core, which can have wavelength-converting properties in the corresponding wavelength range. At wavelengths >500 nm, for example, in the red or IR wavelength range, the core has no significant influence on the transparency of the output coupling element. Here and in the following, transparent means a transmission of greater than 90 or 95% at least for the radiation emitted by a semiconductor chip.

The semiconductor core or the core can be covered by one or more layers as a coating. This coating can be inorganic or organic.

The semiconductor core can be a monocrystalline or polycrystalline agglomerate.

According to at least one embodiment, the quantum dots have an average diameter of 3 nm to 10 nm, particularly preferably 3 nm to 5 nm. The quantum dots can be spherical or rod-shaped. The values here refer in particular to the average diameter of the core, i.e., without coating.

According to at least one embodiment, the method has a step B): producing a suspension. The suspension comprises quantum dots and at least one suspension medium. Preferably, the suspension consists of quantum dots and a suspension medium or a mixture of at least two suspension media. In particular, the quantum dots are highly concentrated in the suspension. This means that the amount of quantum dots in the suspension is between $10^{-6}$ and 0.05 mol/l.

According to at least one embodiment, the suspension has an amide as the suspension medium. The amide is preferably an n,n-dimethylformamide (DMF). In particular, DMF is used in the suspension for pure and dry gallium or indium phosphide particles. Thus, a very thin layer can be produced by evaporation, for example, at 160° C. for optical applications.

Suspension here means in particular a heterogeneous mixture of substances from the suspension medium and finely distributed particles therein, the quantum dots.

According to at least one embodiment, the semiconductor material is gallium phosphide (GaP). Gallium phosphide can be produced from gallium halide and an alkali phosphide. In particular, a gallium chloride is used as the gallium halide. Alternatively or additionally, a sodium phosphide is used as the alkali phosphide.

For example, commercial gallium chloride can be mixed with sodium phosphide in the same ratio. Benzene can be used as a suspension medium. The mixture can be boiled under argon reflux at 75° C. for two hours. This results in gallium phosphide and sodium chloride. The gallium phosphide can be dried and stored under argon. Sodium chloride can be extracted with water.

Indium phosphide can also be produced similarly. Indium chloride and sodium phosphide can be reacted in the same ratio 1:1 in xylene under argon reflux at 90° to indium phosphide and sodium chloride. The indium phosphide can be dried and stored under argon. The sodium chloride can again be extracted with water.

The preparation of gallium phosphide and indium phosphide is known to a person skilled in the art and can be found, for example, in the publications Science in China Series A: Mathematics, May 2002, Vol. 45, Issue 5, pages 661-665; Progress in Crystal Growth and Characterization of Materials, 2000, 40, pages 145-151; Z. Zhang, B. Wang, Part. Part. Syst. Char. 26, 2009, page 53 or Solid State Sciences 12, 2010, pages 1188-1191, "Fabrication and optical properties of gallium phosphide nanoparticulate thin film". Their disclosure content for the preparation of the suspensions is hereby incorporated by reference.

According to at least one embodiment, the method has a step C): directly applying the suspension onto a surface of the optoelectronic component. Alternatively or additionally, the suspension can also be applied directly onto a surface of a carrier. Direct means here that the suspension is applied immediately to the surface of the component and/or carrier. In other words, an additional adhesive layer between the surface of the component and/or carrier and the subsequent output coupling element is not required.

According to at least one embodiment, the surface of the optoelectronic component is a surface of a conversion element. Conversion elements have phosphors that convert, for example, the radiation emitted by a semiconductor chip into radiation with a changed, usually longer wavelength. Alternatively or additionally, the surface of the optoelectronic component is the surface of a semiconductor layer sequence of a semiconductor chip.

According to at least one embodiment, the optoelectronic component has one or more semiconductor layer sequences. The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, where $0 \leq n \leq 1$, $0 \leq m \leq 1$ and $n+m \leq 1$ respectively. The semiconductor layer sequence can have dopants and additional components. For the sake of simplicity, however, only the essential components of the crystal lattice of the semiconductor layer sequence are indicated, i.e., Al, As, Ga, In, N or P, even if these can be partially replaced and/or supplemented by small quantities of other substances.

The semiconductor layer sequence comprises one or more active layers. The at least one active layer is configured to generate electromagnetic radiation. For example, the active layer includes at least one pn-junction or at least one quantum well structure. In particular, ultraviolet, visible and/or near infrared radiation is generated in the active layer during operation of the semiconductor component. The radiation generated in the active layer has a peak wavelength. The peak wavelength is the wavelength at which the highest radiation intensity is generated during the intended operation.

According to at least, the optoelectronic component is a light emitting diode.

According to at least one embodiment, an additional step Bi) centrifuging of the suspension produced in step B) takes place before step C). Thus, quantum dots of different sizes can be separated. In particular, aggregates or agglomerates with a diameter of >500 nm or also >100 nm are being separated.

According to at least one embodiment, the suspension is applied directly onto the surface of a carrier. For example, an epitaxial substrate (wafer) can serve as a carrier.

According to at least one embodiment, the method has a step D): removing the suspension medium to produce the output coupling element. In particular, the output coupling element is matrix-free. Here and in the following, this means that the quantum dots are not embedded in any matrix material such as silicone or epoxy. Preferably, the output coupling element consists exclusively of the quantum dots. Consist of here means that the output coupling element is formed exclusively of the quantum dots and potentially has a small amount of impurities, in particular in the ppm range. The suspension medium can, for example, be removed by evaporation using pressure and/or heat.

In addition, the output coupling element is transparent for radiation of the red and/or IR range. Here and in the following, radiation of the red range means a wavelength of approximately 600 nm to 780 nm, for example, a wavelength of 660 nm or 730 nm. In addition, the gallium phosphide nanoparticles can also be used steplessly for green (approx. 540 nm) and/or yellow (approx. 590 nm) or all relevant color nuances due to their absorption or transparency. Here and in the following, radiation of the IR range means a wavelength of 750 nm to 2000 nm, in particular between 800 nm and 950 nm.

According to at least one embodiment, the output coupling element is formed as a lens. Alternatively or additionally, the output coupling element is formed as a layer. The layer of the output coupling element preferably has a layer thickness between 0.1 and 1 mm.

According to at least one embodiment, step C) is carried out by spin coating, spray coating and/or wet chemical deposition.

According to at least one embodiment, the suspension is applied directly onto the surface of the carrier. Subsequently, the suspension medium is removed so that the output coupling element is produced directly on the surface of the carrier. A further suspension, comprising quantum dots, can be produced as a layer on the surface of the optoelectronic component, wherein the carrier is subsequently removed from the output coupling element and the output coupling element is applied to the layer of quantum dots. The further suspension can have the same features as the suspension. Preferably, the suspension and the further suspension have the same quantum dots. Alternatively, different quantum dots can be present in the suspension and the further suspension. The suspension medium in the suspension or in the further suspension can be the same or different. The layer applied to the surface of the optoelectronic component can have a layer thickness of 10 to 100 µm.

According to at least one embodiment, the surface of the carrier is non-stick coated. This is advantageous because the output coupling element can thus easily be removed from the carrier. Alternatively or additionally, the surface of the optoelectronic component is non-stick coated.

According to at least one embodiment, step D) is carried out by baking out. For example, the carrier and/or the component is thermally baked out. The carrier can, for example, be a sapphire wafer or a silicon wafer. The baking out can be carried out by an external heater, which can generate a temperature of <200° C. Thus, a cured output coupling element can be produced as a thin film or as a lens. The suspension medium can be evaporated, for example, when the suspension is applied to the surface of the optoelectronic component. The suspension medium can be removed by a heater to produce the output coupling element.

According to at least one embodiment, the output coupling element is applied without adhesive onto the surface of the optoelectronic component. Alternatively or additionally, the output coupling element is applied without adhesive onto the surface of the carrier.

The inventor has recognized that the use of an output coupling element described here can provide an optoelectronic component that has an increased decoupling, for example, from the semiconductor layer sequence and/or from the conversion element. The output coupling element is formed matrix-free, i.e., it preferably only has the quantum dots. The output coupling element is highly refractive and can easily be applied to a surface of an optoelectronic component, in particular a light-emitting diode.

Embodiments also relate to an output coupling element for an optoelectronic component. The output coupling element is preferably produced using a method described here. All the embodiments and definitions made so far for the method also apply to the output coupling element and vice versa.

According to at least one embodiment, the output coupling element only has quantum dots. The output coupling element therefore consists of quantum dots and is matrix-free. The output coupling element is transparent for radiation of the red and/or IR range.

In at least one embodiment, the method for producing an output coupling element for an optoelectronic component includes the steps: A) providing quantum dots each with a core having a semiconductor material, B) producing a suspension having the quantum dots in a suspension medium, C) directly arranging the suspension between a surface of the optoelectronic component and a surface of a carrier to produce the output coupling element. The output coupling element can be matrix-free, has quantum dots and a suspension medium, and is transparent to radiation of the red and/or IR range.

BRIEF DESCRIPTION OF THE DRAWINGS

Further advantages, advantageous embodiments and developments result from the exemplary embodiments described in the following in connection with the figures.

In the exemplary embodiments and in the figures, identical, similar and similarly acting elements can each be provided with the same reference numbers. The elements shown and their proportions in relation to one another are not to be regarded as true to scale. Rather, individual elements such as layers, components, devices and areas can be displayed exaggeratedly large for better representability and/or better understanding.

DETAILED DESCRIPTION OF ILLUSTRATIVE EMBODIMENTS

Figure 1A:
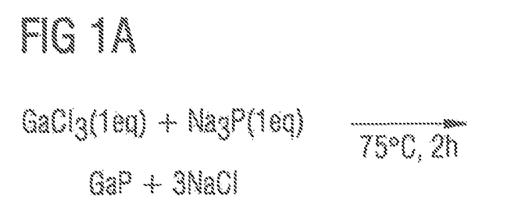
FIGS. 1A and 1B each shows a method for producing an output coupling element according to an embodiment, FIGS. 2A to 2C, 4A to 4C and 5A to 5C each shows a method for producing an output coupling element for an optoelectronic component, and FIGS. 3A to 3E each shows an optoelectronic component with an output coupling element according to an embodiment.
Figure 1B:
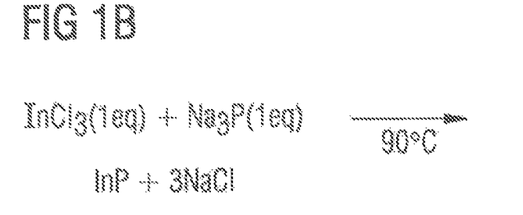

FIG. 1A shows a possible synthesis for the production of an output coupling element according to an embodiment. For example, gallium chloride, which is commercially available, can be boiled in the same ratio with sodium phosphide at 75° C. for two hours in benzene under argon reflux until gallium phosphide and sodium chloride are produced. Gallium phosphide can be dried and stored under argon. Sodium chloride can be extracted with water. Accordingly, as shown in FIG. 1B, indium phosphide can also be produced from indium chloride and sodium phosphide. Alternatively, other gallium or indium halides can be used to produce gallium or indium phosphide.

Alternatively, other alkali phosphides can also be used to produce gallium or indium phosphide. Indium phosphide is boiled in xylene under argon reflux at higher temperatures of 90° C., for example.

Dimethylformamide (DMF) can also be used as a suspension medium instead of benzene or xylene. The suspension medium can subsequently be evaporated, for example, at 160° C., to produce an optical element, i.e., an output coupling element.

Figure 2A:
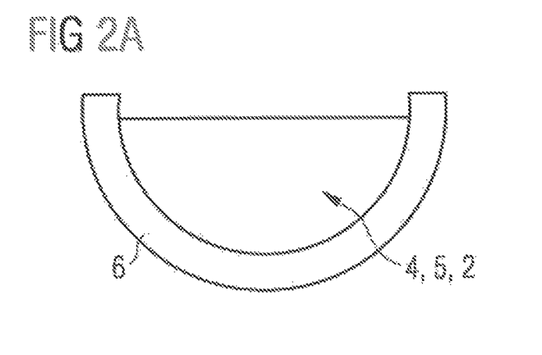
Figure 2B:
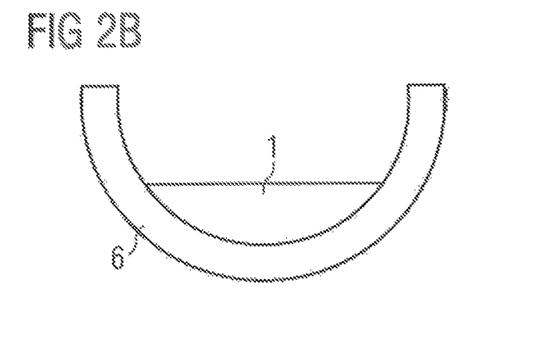
Figure 2C:
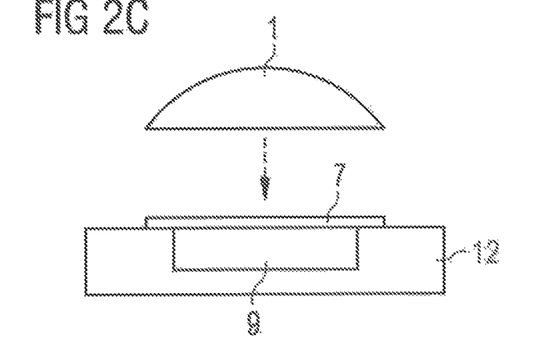

FIGS. 2A to 2C show the production of an optoelectronic component 100 according to an embodiment. Here, the output coupling element 1 is formed as a lens. FIG. 2A shows a carrier 6 which is preferably U-shaped to produce a convex lens. A quantum dot suspension as concentrated as possible, of gallium phosphide, for example, can be applied to the carrier in DMF as a suspension medium.

The suspension medium can subsequently be removed by evaporation and subsequent drying, for example, at <200° C. The result is an output coupling element 1, which preferably consists of the quantum dots, is matrix-free and transparent to radiation of the red and/or IR range (FIG. 2B).

FIG. 2C shows applying the output coupling element 1 to a layer 7, which also has quantum dots, for example, of gallium phosphide. The thin layer 7 was also produced by a further suspension of quantum dots and suspension medium and subsequent removal of the suspension medium and drying. For example, layer 7 can be deposited on a substrate 12 of an optoelectronic component 100 and/or on a semiconductor layer sequence 9. Subsequently, the output coupling element 1 can be applied to the further suspension 7 or layer 7. In this way, the output coupling element 1 can be applied to the surfaces 1001 of an optoelectronic component 100 without adhesive, i.e., free of silicone or epoxy, for example. Applying the output coupling element 1, here formed as a lens, is virtually solvent-free and can be baked together with the other suspension or layer 7. Baking can take place, for example, by heating. Layer 7 can be produced before applying the output coupling element 1. Alternatively, layer 7 can be produced after applying the output coupling element 1. For this purpose, the output coupling element 1 is applied to the further suspension 7 and subsequently the suspension medium is removed from the further suspension 7 to produce layer 7.

Figure 4A:
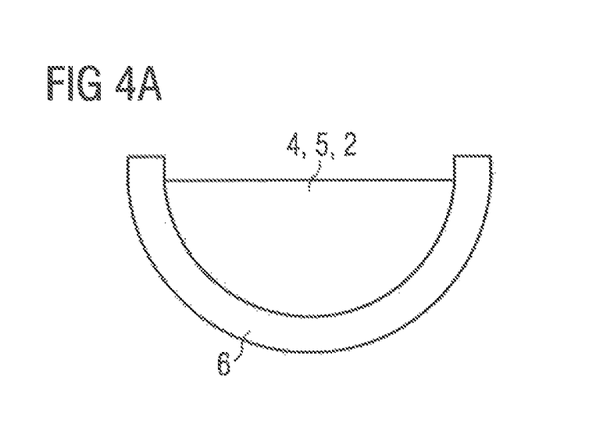
Figure 4B:
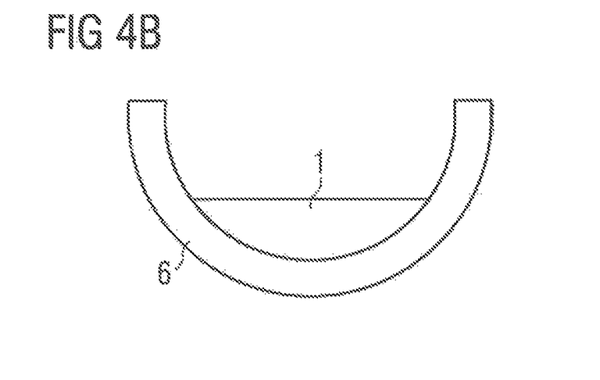
Figure 4C:
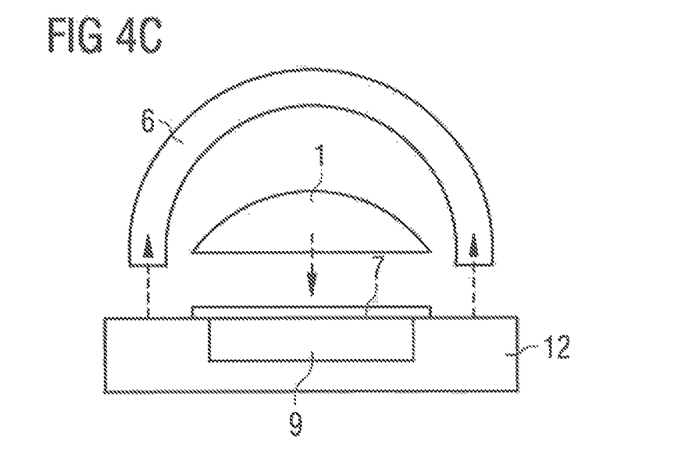

FIGS. 4A to 4C show the production of an optoelectronic component 100 according to one embodiment. The method of the FIGS. 4A to 4C differs from the method of the FIGS. 2A to 2C in that the lens 1 is applied together with the carrier 6 on the layer 7. The carrier 6 can subsequently be removed. So first, the thin layer 7, for example, a GaP suspension is applied to the substrate 12 and the semiconductor layer sequence 9. The virtually solvent-free output coupling element 1 can then be attached and baked together with layer 7 in a heating step. In this exemplary embodiment, carrier 6, which can be a hollow lens, is only used for shaping. A relatively large light scattering at the GaP nanoparticle lens is to be expected.

Figure 5A:
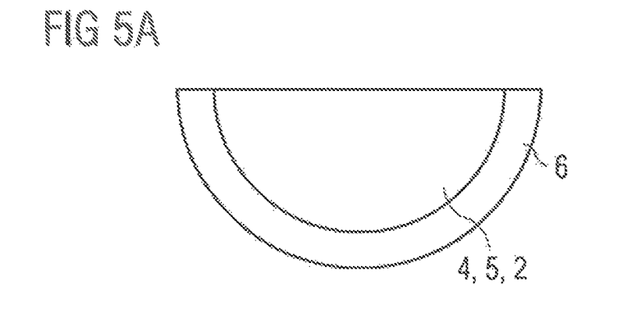
Figure 5B:
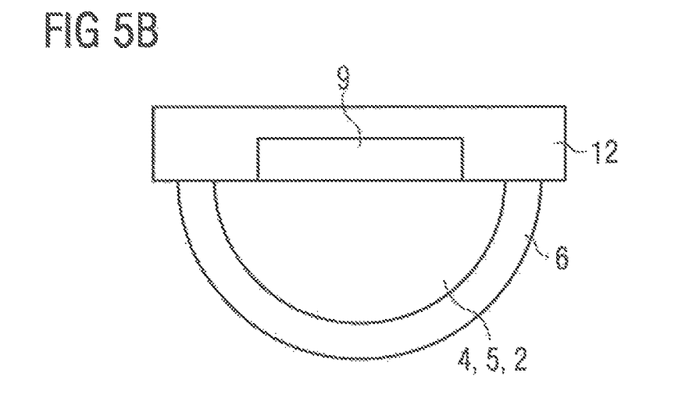
Figure 5C:
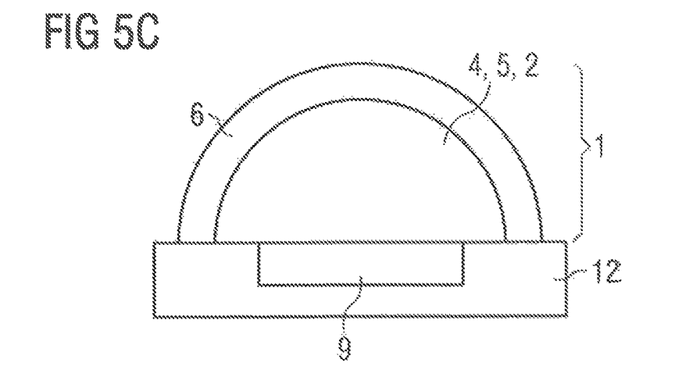

As an alternative to the methods of FIG. 2A to 2C or 4A to 4C, the carrier 6, for example, a hollow lens, can finally remain on the component 100 to enclose the quantum dots 2, in particular InP or GaP nanoparticles, and the necessary suspension medium 5, in particular xylene or DMF. A certain amount of suspension medium 5 is in particular necessary to prevent quantum dots 2 from agglomerating and precipitating from the solution (FIGS. 5A to 5C). As shown in FIG. 5B, carrier 6 and substrate 12 are joined together, for example, glued. As shown in FIG. 5C, the suspension 4 is hermetically sealed between carrier 6 and substrate 12. In particular, suspension 4 was concentrated or evaporated. The suspension has quantum dots 2, in particular GaP or InP, and a suspension medium 5, such as xylene or DMF.

FIGS. 3A to 3E each show an optoelectronic component 100 with an output coupling element 1 according to an embodiment.

Figure 3A:
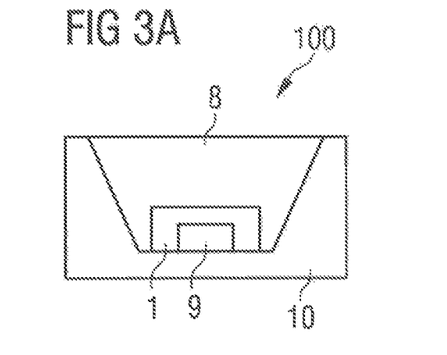

The optoelectronic component 100 of FIG. 3A has a semiconductor layer sequence 9 which is arranged in a recess 8 of a housing 10. The surface of the semiconductor layer sequence 9 can be at least partially (not shown here) or completely surrounded by the output coupling element 1 in a material and/or form-fit manner. Thus, the decoupling efficiency of the radiation emitted by the semiconductor layer sequence 9 can be increased.

Figure 3B:
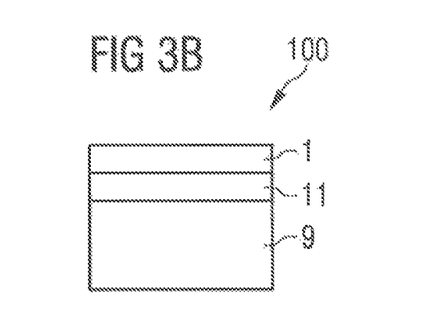

FIG. 3B shows a semiconductor layer sequence 9 with a conversion element 11 subordinate to it. The output coupling element 1 is subordinate to the conversion element 11. The output coupling element 1 is here formed as a layer. The output coupling element 1, for example, can have a layer thickness of 1 to 50 μm.

Figure 3C:
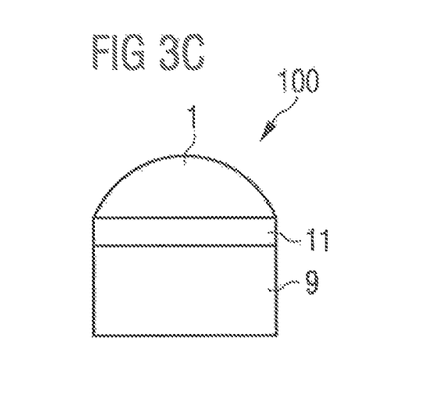

FIG. 3C differs from FIG. 3B in that the output coupling element 1 is formed here as a lens and applied directly to the conversion element 11.

Figure 3D:
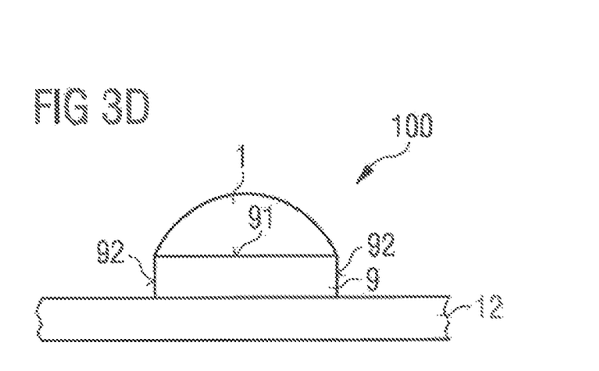

FIG. 3D shows a substrate 12, for example, a circuit board or wafer, on which a semiconductor layer sequence 9 is applied. Preferably, only the radiation emission surface 91 with a main emission direction of the semiconductor layer sequence 9 is covered with the output coupling element 1. The side surfaces 92 of the semiconductor layer sequence 9 are thus free of the output coupling element 1. The main emission direction of the semiconductor layer sequence 9 is preferably parallel to the growth direction.

Figure 3E:
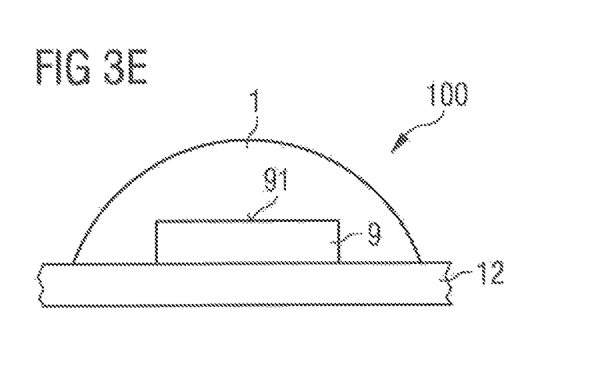

FIG. 3E shows a substrate 12 on which the semiconductor layer sequence 9 is applied. In contrast to FIG. 3D, the optoelectronic component 100 of FIG. 3E has the output coupling element 1 which completely covers both the radiation emission surface and the side surfaces of the semiconductor layer sequence 9. Thus, both the decoupling via the main radiation emission surface 91 and via the side surfaces 92 can be increased.

The exemplary embodiments described in connection with the figures and their features can also be combined with each other according to further exemplary embodiments, even if such combinations are not explicitly shown in the figures. Furthermore, the exemplary embodiments described in connection with the figures may have additional or alternative features as described in the general part.

The invention is not limited to exemplary embodiments by the description thereof. Rather, the invention includes each new feature and each combination of features, which in particular includes any combination of features in the patent claims, even if that feature or combination itself is not explicitly stated in the patent claims or exemplary embodiments.

The invention claimed is:

1. A method for producing an output coupling element, the method comprising:
   producing a suspension having quantum dots in a suspension medium, wherein each quantum dot comprises a core having a semiconductor material;
   directly applying the suspension onto a surface of an optoelectronic component and/or onto a surface of a carrier; and
   removing the suspension medium for producing the output coupling element, wherein the output coupling element is matrix-free and transparent to radiation of a red range and/or an IR range.

2. The method according to claim 1, wherein the semiconductor material is selected from the group consisting of GaP, InP, GaAs and InGaAlP.

3. The method according to claim 1, wherein the output coupling element consists essentially of the quantum dots.

4. The method according to claim 1, wherein the semiconductor material is GaP or InP.

5. The method according to claim 1, wherein the output coupling element is formed as a lens.

6. The method according to claim 1, wherein the surface of the optoelectronic component is a surface of a conversion element or of a semiconductor layer sequence.

7. The method according to claim 1, wherein the surface of the carrier is non-stick coated.

8. The method according to claim 1, wherein the output coupling element is applied without an adhesive onto the surface of the optoelectronic component.

9. The method according to claim 1, wherein the output coupling element is applied without an adhesive onto the surface of the carrier.

10. The method according to claim 1, wherein the semiconductor material is GaP and is produced from gallium halide and an alkali phosphide.

11. The method according to claim 10, wherein the gallium halide is a gallium chloride.

12. The method according to claim 10, wherein the alkali phosphide is a sodium phosphide.

13. The method according to claim 1, wherein directly applying the suspension comprises spin coating, spray coating or wet chemical depositing the suspension.

14. The method according to claim 1, wherein the suspension has an amide as the suspension medium.

15. The method according to claim 1, wherein the suspension medium is N,N-dimethylformamide.

16. An output coupling element produced according to claim 1.

17. A method for producing an output coupling element, the method comprising:
- producing a suspension having quantum dots in a suspension medium, wherein each quantum dot comprises a core having a semiconductor material;
- directly applying the suspension onto a surface of an optoelectronic component and/or onto a surface of a carrier; and
- removing the suspension medium for producing the output coupling element,
- wherein the output coupling element is matrix-free and transparent to radiation of a red range and/or an IR range, and
- wherein the output coupling element is formed as a lens.

18. A method for producing an output coupling element, the method comprising:
- producing a suspension having quantum dots in a suspension medium, wherein each quantum dot comprises a core having a semiconductor material;
- directly applying the suspension onto a surface of a carrier;
- subsequently removing the suspension medium so that the output coupling element is produced directly on the surface of the carrier;
- producing a further suspension comprising quantum dots as a layer on a surface of an optoelectronic component;
- subsequently removing the carrier from the output coupling element; and
- applying the output coupling element to the layer of quantum dots,
- wherein the output coupling element is matrix-free and transparent to radiation of a red range and/or an IR range.

19. The method according to claim 18, wherein the output coupling element is applied without an adhesive onto the surface of the optoelectronic component.

20. The method according to claim 18, wherein the semiconductor material is GaP or InP, and wherein the suspension medium is N,N-dimethylformamide.

* * * * *